United States Patent [19]
Schechtel et al.

[11] Patent Number: 6,137,689
[45] Date of Patent: Oct. 24, 2000

[54] PROTECTIVE ENCLOSURE APPARATUS AND METHOD

[75] Inventors: Kevin J. Schechtel, Prairie View; David R. Zeiger, Palatine; Michael B. Grimm, Mount Prospect, all of Ill.

[73] Assignee: 3Com Corporation, Rolling Meadows, Ill.

[21] Appl. No.: 09/086,505

[22] Filed: May 28, 1998

[51] Int. Cl.$^7$ .............................. H05K 5/02; H05K 5/03
[52] U.S. Cl. .................... 361/759; 361/752; 361/816; 174/5 R; 174/52.1; 174/52.3; 174/35 R; 206/701; 206/706; 220/4.02
[58] Field of Search .................... 361/740, 752, 361/753, 759, 796, 800, 801, 816, 818; 174/5 R, 35 GC, 35 R, 92, 52.1, 52.3, 52.4, 138 F; 206/701, 706, 709; 220/4.02

[56] References Cited

U.S. PATENT DOCUMENTS

| | | | |
|---|---|---|---|
| 4,092,698 | 5/1978 | Brefka | 361/752 |
| 4,173,387 | 11/1979 | Zell | 439/557 |
| 4,435,031 | 3/1984 | Black et al. | 439/82 |
| 4,451,693 | 5/1984 | Vest | 174/52.1 |
| 4,692,571 | 9/1987 | Trinh et al. | 361/759 |
| 4,716,499 | 12/1987 | Bhargava | 361/740 |
| 4,736,266 | 4/1988 | Tanibe | 361/816 |
| 4,807,759 | 2/1989 | Castner | 220/4.02 |
| 4,821,152 | 4/1989 | Lorenzen | 361/767 |
| 4,836,408 | 6/1989 | Roy | 220/4.02 |
| 4,911,661 | 3/1990 | Neuwirth | 439/718 |
| 4,970,353 | 11/1990 | Kotz | 174/138 F |
| 5,014,160 | 5/1991 | Mc Coy, Jr. | 361/818 |
| 5,160,807 | 11/1992 | Fry et al. | 174/35 R |
| 5,254,016 | 10/1993 | Ganthier | 439/567 |
| 5,353,201 | 10/1994 | Maeda | 361/816 |
| 5,482,474 | 1/1996 | Yohn et al. | 439/79 |
| 5,491,614 | 2/1996 | Fowler et al. | 361/796 |
| 5,535,100 | 7/1996 | Lubahn et al. | 361/801 |
| 5,618,129 | 4/1997 | Skarivoda | 361/759 |
| 5,740,013 | 4/1998 | Roesner et al. | 361/816 |
| 5,740,019 | 4/1998 | Lee | 361/759 |
| 5,838,542 | 11/1998 | Nelson et al. | 361/818 |
| 5,944,210 | 8/1999 | Yetter | 220/4.02 |

*Primary Examiner*—Jeffrey Gaffin
*Assistant Examiner*—John B. Vigushin
*Attorney, Agent, or Firm*—Baniak Nicholas Pine & Gannon

[57] ABSTRACT

A protective enclosure apparatus includes a base and a cover. The base includes a plurality of pins each including cap portion. The cap portion includes a contact surface. A cover includes a plurality of cover openings formed therein for receiving the pins and a latch portion communicating with each of the cover openings. The latch portion is angled to allow an end portion of the latch portion to engage with the contact surface and to allow the latch portion to be biased toward the plurality pins when the cover is pulled away from the base.

17 Claims, 8 Drawing Sheets

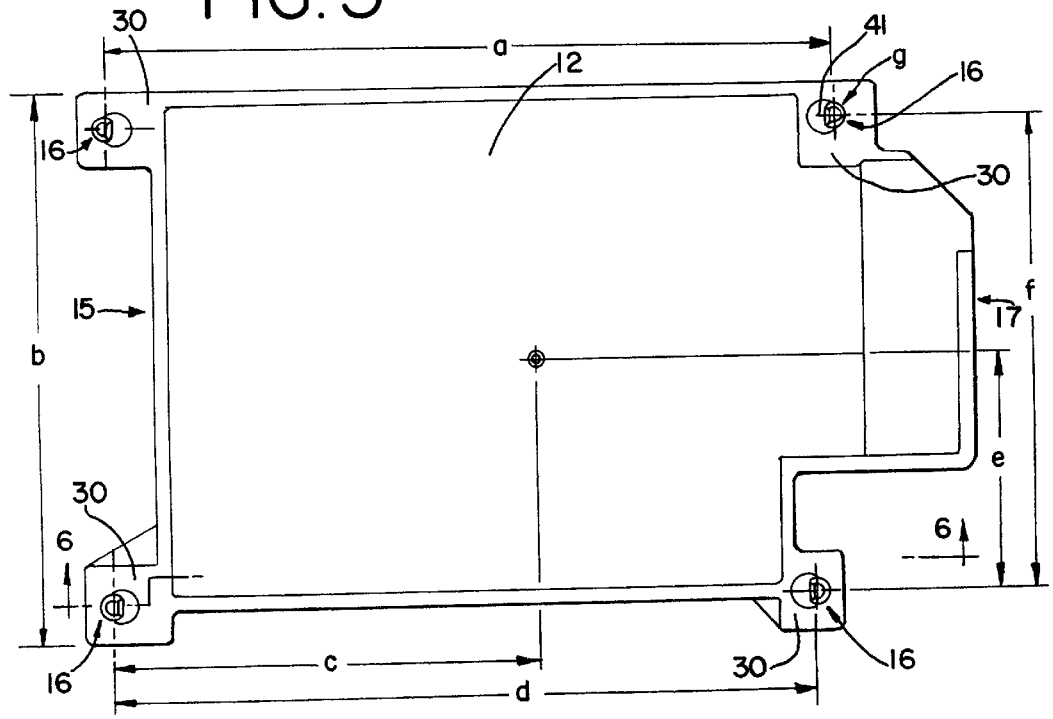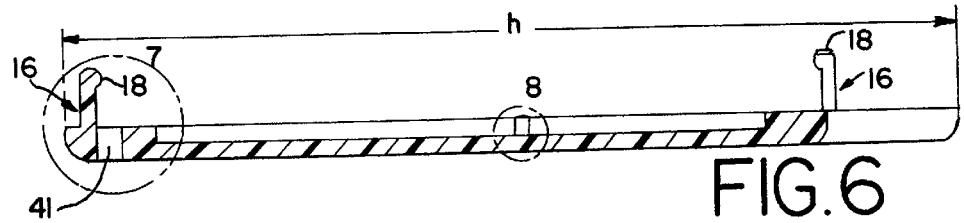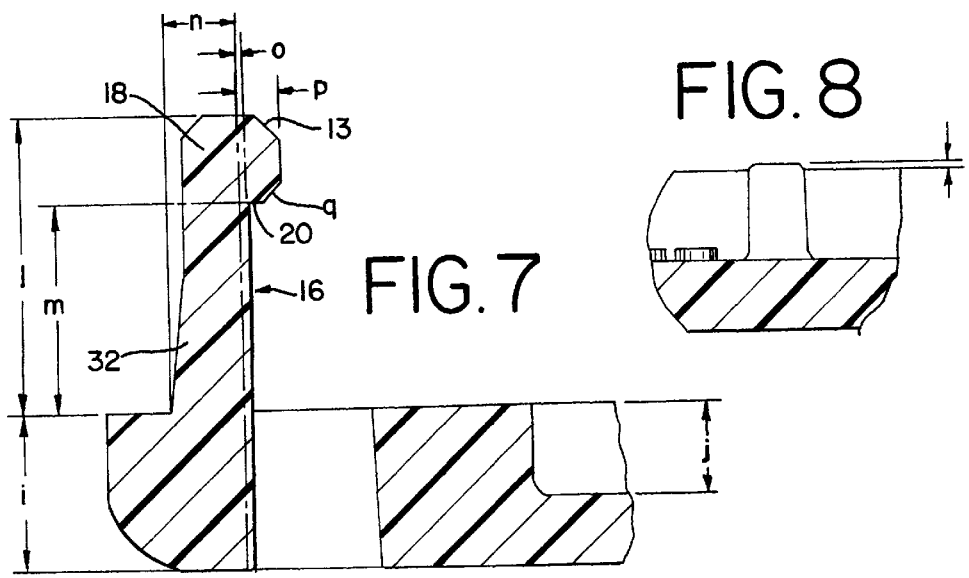

PROTECTIVE ENCLOSURE APPARATUS AND METHOD

FIELD OF THE INVENTION

This invention relates generally to the field of protective enclosures, and in particular, to a protective enclosure for shielding a user from harmful voltages carried by electronic components mounted on a flat substrate such as a printed circuit board.

BACKGROUND OF THE INVENTION

Electronic business equipment such as, for example, telecommunication devices, computers, and modems, typically have a wide variety of voltage carrying electronic components mounted onto a printed circuit board. United States and international regulatory standards may require that these types of equipment have no exposed areas where an operator may come into contact with hazardous voltages.

Attempts have been made to cover electronic components that are mounted onto a printed circuit board. A one piece plastic housing has been used which includes a base portion and a cover portion joined by a flexible hinged portion which runs along the entire length of the housing. The housing is typically attached to the printed circuit board by positioning a section of the printed circuit board between the base portion and the cover portion, folding the base portion and the cover together, and mechanically fastening the base portion to the cover portion through the printed circuit board. However, the fold over design may not be compatible with every type of circuit board, and the hinged design restricts the placement of the housing on the circuit board.

Moreover, conventional mechanical fasteners that have been used to fasten the base portion to the cover portion such as, for example, rivets, screws or bolts, have several disadvantages. Riveting is time and labor intensive which increases manufacturing costs. Moreover, if the electronic components need to be accessed to be serviced or reconfigured, the removal of rivets may cause damage to the circuit board. Using screws or bolts is very expensive and is also time and labor intensive.

Conventional welding techniques, such as sonic welding, have been used to permanently fasten the cover portion to the base portion. However, the welding is labor intensive and does not provide a convenient way to remove the cover portion from the base portion.

Accordingly, it would be desirable to have a protective cover apparatus that overcomes the disadvantages described above, and to provide a simple and cost effective protective cover apparatus.

SUMMARY OF THE INVENTION

One aspect of the invention provides a protective enclosure apparatus including a base and a cover. The base includes a plurality of pins each having a cap portion which includes a contact surface. A cover includes a plurality of cover openings formed therein for receiving the pins, and a latch portion communicating with each of the cover openings. The latch portion is angled to allow an end portion of the latch portion to engage with the contact surface and to allow the latch portion to be biased toward the pins when the cover is pulled away from the base. The latch portion may preferably be angled at about 30 degrees from an end wall of the cover. The plurality of pins may comprise four pins each of which may be positioned adjacent a corner portion of the base and may extend perpendicular from the base. The plurality of pins may further include a rib portion which extends along the pins and which are retained between guides which extend from an inner wall of each of the plurality of cover openings. The plurality of pins may have a length which allows the pins to pass through substrate openings formed in a planer substrate and engage with the latch portion. The planer substrate may be a circuit board. The base may be a substantially planar member and may be formed from a single piece of insulative material such as plastic. The cover may also be formed from a single piece of insulative material such as plastic. The cover may be adapted to fit over at least one electronic component mounted on a circuit board and allow the plurality of pins to engage with the latch portion.

According to another aspect of the invention, a method of operating a enclosure apparatus is provided. A base including a plurality of pins is provided. The pins include a cap portion having a contact surface. A cover includes a plurality of cover openings formed therein for receiving the pins, and an angled latch portion communicating with each of the cover openings. The plurality of pins is inserted into the cover openings. The latch portion is deflected with the cap portion. The cap portion is retained within the cover openings with the latch portion. Disengagement of the cover from the base may be prevented by contacting an end portion of the latch against the contact surface and creating a moment to bias the latch portion toward the pin.

Another aspect of the invention provides a method of enclosing an electronic component mounted on a circuit board to prevent electric shock. A circuit board having a first side and a second side is provided. At least one electronic component is mounted onto the first side of a circuit board having a plurality of circuit board openings. A base includes a plurality of pins each having a cap portion which includes a contact surface. A cover includes a plurality of cover openings formed therein for receiving the pins, and an angled latch portion communicating with each of the cover openings. The base is positioned on the second side of the circuit board. The plurality of pins are inserted into the plurality of circuit board openings so that the cap portion extends past the first side of the circuit board. The cover portion is positioned on the first side of the circuit board and the plurality of pins are inserted into the cover openings. The latch portion is deflected with the cap portion and the cap portion is retained within the cover openings with the latch portion. Removal of the cover from the base is prevented by contacting an end portion of the latch portion against the contact surface and creating a moment to bias the latch portion toward the pins. A plurality of base openings formed in the base adjacent the plurality of pins may also be provided. A disengagement apparatus including a disengagement base and a plurality of disengagement pins which extend from the disengagement base may also be provided. The disengagement pins may be inserted into the base openings. The latch portion may be deflected away from the contact surface to allow the cover to be separated from the base.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which are defined by the appended claims and equivalents thereof.

BRIEF DESCRIPTION OF THE DRAWINGS

FIG. 5 is a plan view of a base which is made in accordance with the invention;

FIG. 6 is a sectional view taken along lines 6—6 of FIG. 5;

FIG. 7 is an enlarged view of the circled region 7 of FIG. 6;

FIG. 8 is an enlarged view of the circled region 8 of FIG. 6;

DESCRIPTION OF THE PRESENTLY PREFERRED EMBODIMENTS

Figure 1:
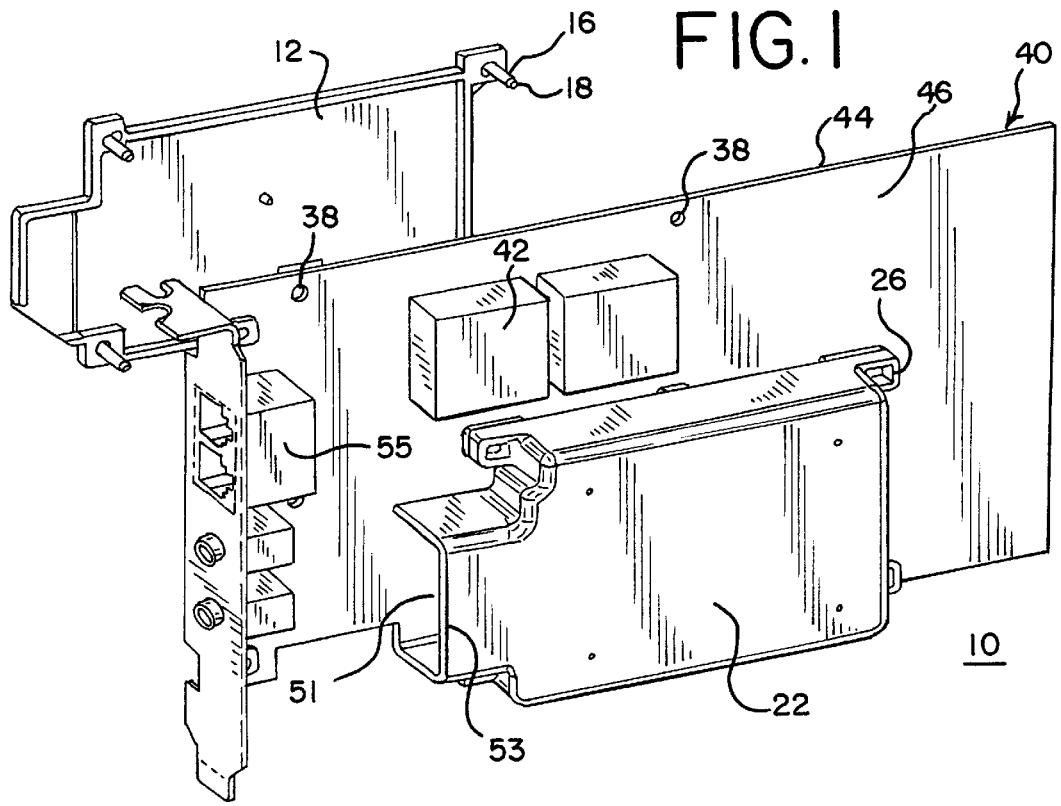
FIG. 1 is an exploded perspective view of a preferred embodiment of a protective enclosure apparatus which is made in accordance with the invention.
Figure 2:
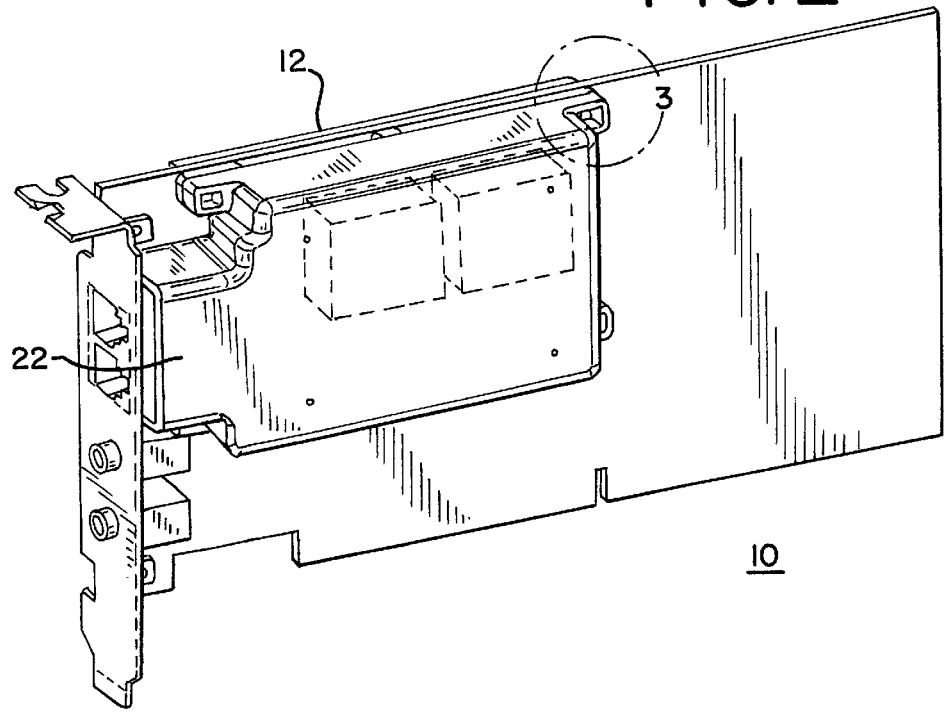
FIG. 2 is a perspective view of the apparatus of FIG. 1 in the mounted position.
Figure 3:
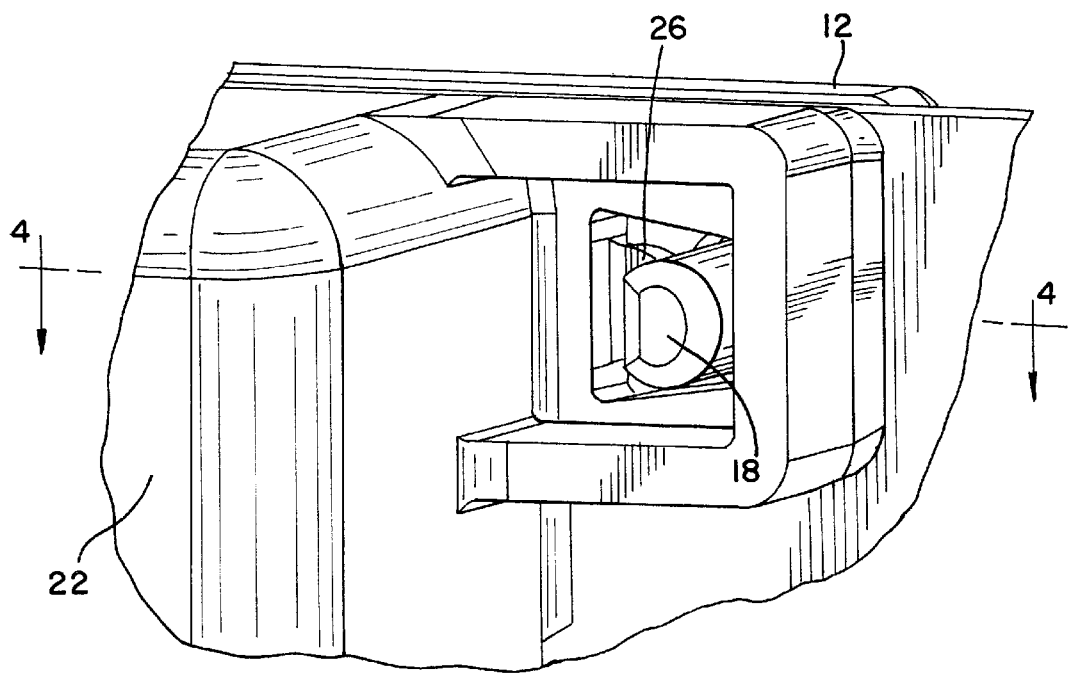
FIG. 3 is an enlarged view of circled region 3 of FIG. 2.
Figure 12:
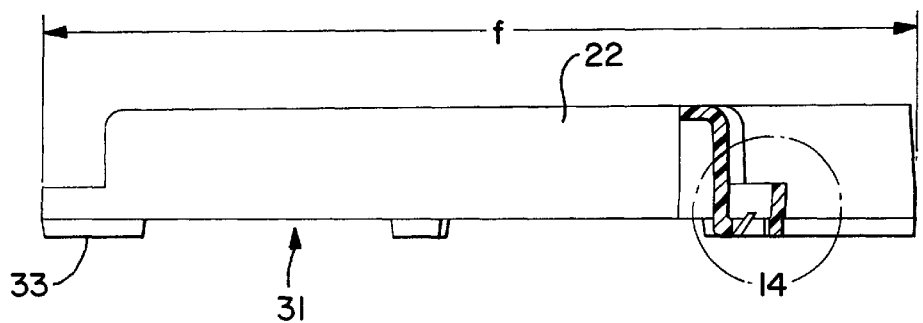
FIG. 12 is a sectional view taken along lines 12—12 of FIG. 11.
Figure 13:
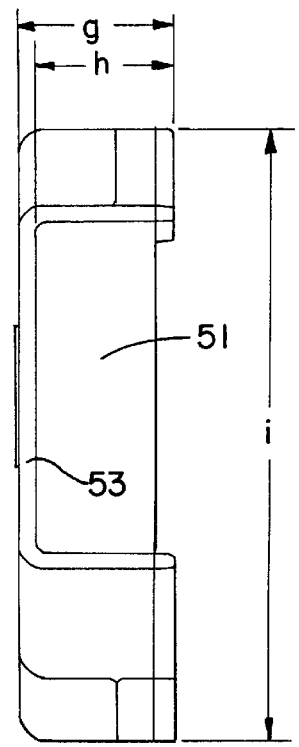
FIG. 13 is an end view of the cover of FIG. 11.
Figure 14:
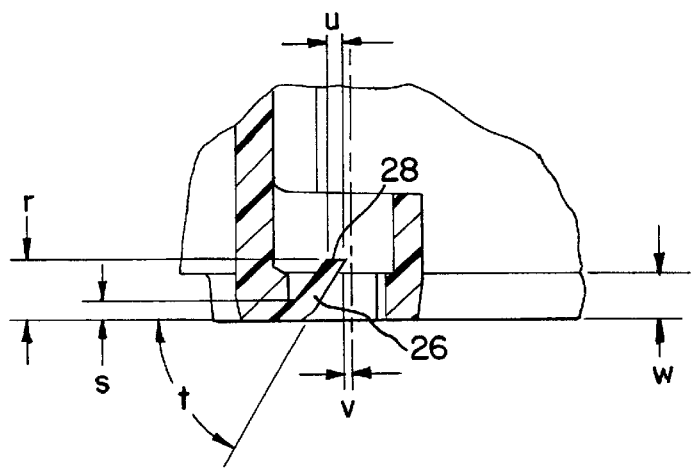
FIG. 14 is an enlarged view of the circled region 14 of FIG. 12.
Figure 15:
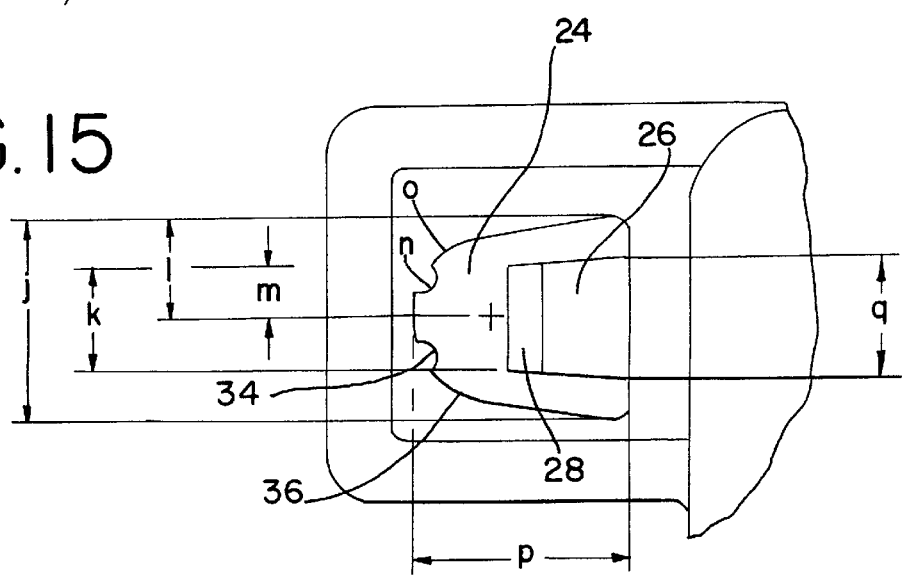
FIG. 15 is an enlarged view of the circled region 15 of FIG. 11.
Figure 16:
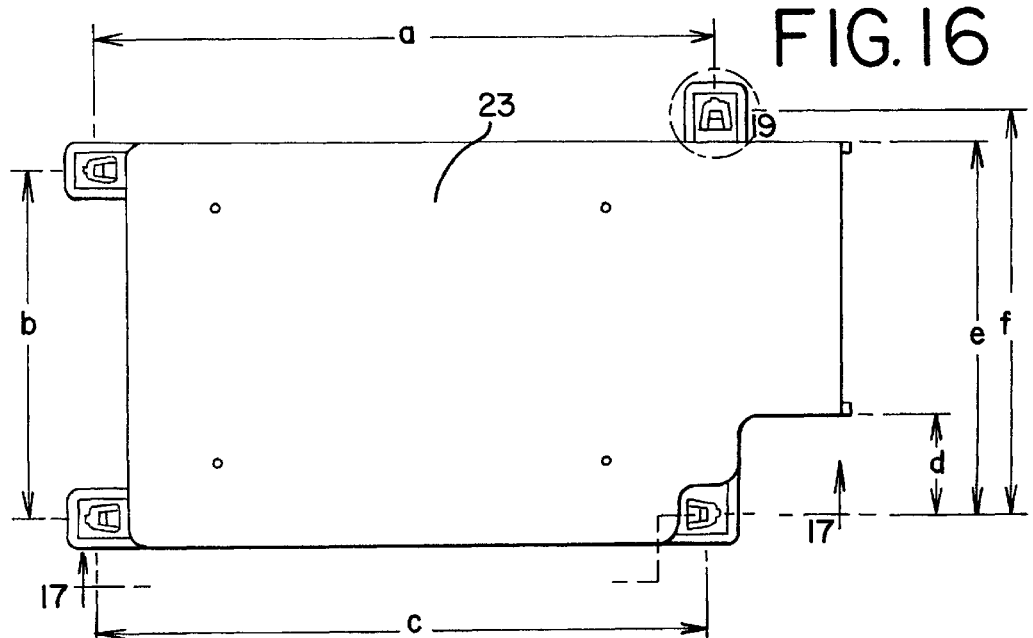
FIG. 16 is a plan view of an alternative embodiment of a cover which is made in accordance with the invention.
Figure 17:
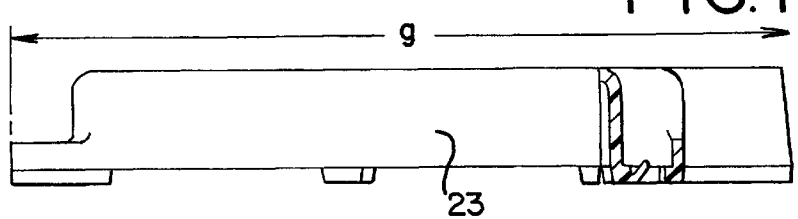
FIG. 17 is a sectional view taken along lines 17—17 of FIG. 16.
Figure 18:
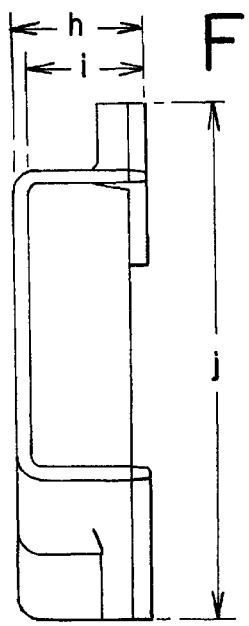
FIG. 18 is an end view of the cover of FIG. 16.
Figure 19:
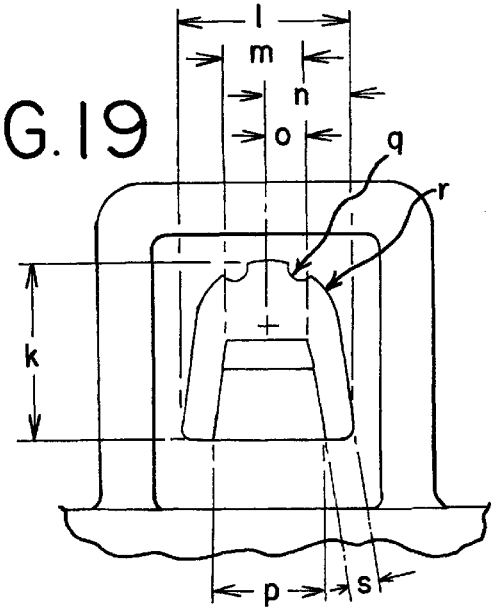
FIG. 19 is an enlarged view of the circled region 19 of FIG. 16.

As shown in FIGS. 1–2, a preferred embodiment of a protective enclosure 10 apparatus includes a base 12 and a cover 22. As shown in FIGS. 5–7, the base 12 includes a plurality of pins 16 each having a cap portion 18. The cap portion 18 includes a contact surface 20. As shown in FIGS. 11–15, the cover 22 includes a plurality of cover openings 24 formed therein for receiving the pins 16, and a latch portion 26 communicating with each of the openings 24. As shown in FIG. 14, the latch portion 26 is angled to allow an end portion 28 of the latch portion 26 to engage with the contact surface 20 of the cap portion 18 and to allow the latch portion 26 to be biased toward the pins 16 when the cover 22 is pulled away from the base 12.

Figure 9:
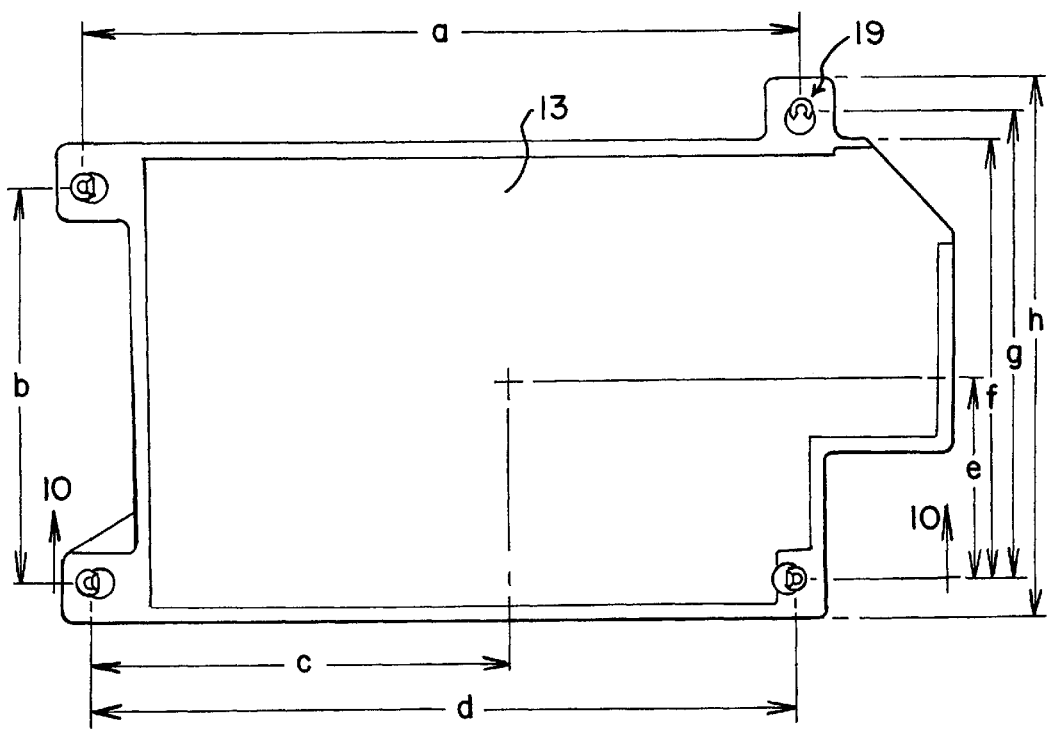
FIG. 9 is a plan view of an alternative embodiment of a base which is made in accordance with the invention.
Figure 10:
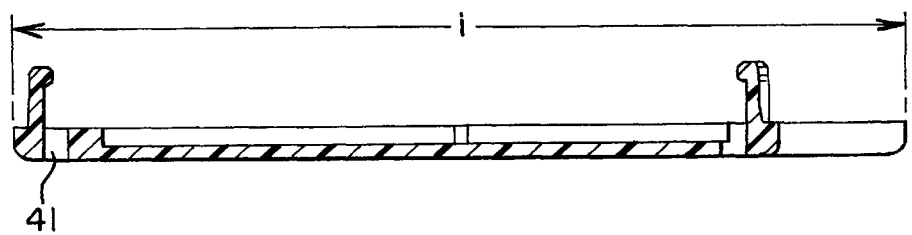
FIG. 10 is a sectional view taken along lines 10—10 of FIG. 9.
Figure 11:
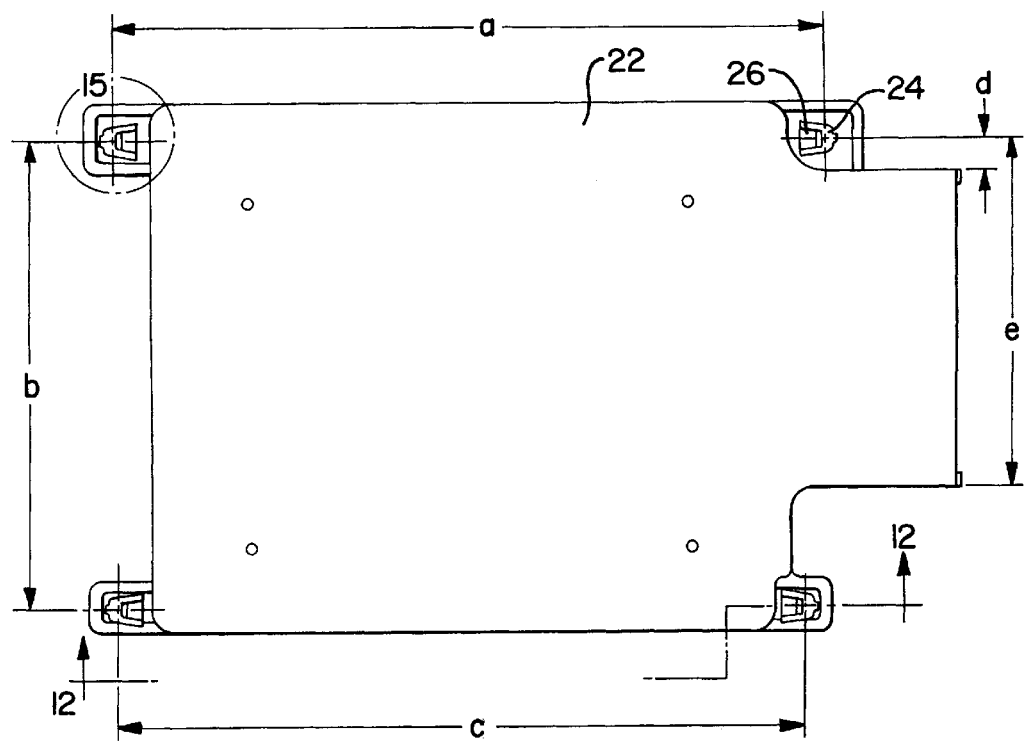
FIG. 11 is a plan view of a cover which is made in accordance with the invention.

As shown in FIGS. 5–6, a plurality of base openings 41 may preferably be formed in the base 12 adjacent the pins 16. The base 12 may preferably be a substantially planar member. In the embodiment shown, the base 12 is generally rectangular in shape, although other shapes and configurations are contemplated. The base 12 is preferably formed a single piece of insulative material such as, for example, plastic. The plastic may preferably be flame retardant to meet UL requirements, and may consist of, for example, polycarbonate ABS plastic. In the embodiment shown in FIGS. 5–8, the dimensions of the base 12 may be, for example: a=3.195 inches, b=2.45 inches, c=1.87 inches, d=3.090 inches, e=1.05 inches, f=2.110 inches, g=4X Ø.100+0.5° D/S (draft per side), h=3.90 inches, i=0.14 inches, j=0.080 inches, and k=0.005 inches. Other dimensions may be utilized without departing from the spirit and scope of the invention. For example, in the alternative embodiment of the base 13 shown in FIGS. 9–10, the dimensions of the base 13 may be a =3.155 inches, b=1.777 inches, c=1.85 inches, d=3.110 inches, e=0.90 inches, f=1.97 inches, g=2.093 inches, h=2.415 inches, and i=3.93 inches.

As shown in FIGS. 5–7, the pins 16 may preferably be integrally formed with the base 12. Alternatively, the pins 16 may be separate members. In the embodiment shown, four pins 16 are provided, each of which are positioned adjacent a corner portion 30 of the base 12. The number of pins 16 may vary depending upon the particular application. In the embodiment shown, the plurality of pins 16 may preferably extend in a direction perpendicular from the base 12. In the embodiment shown in FIGS. 5–6, the pins 16 located at one end 15 of the base 12 may preferably be oriented in the opposite direction as the pins 16 located at a second end 17 of the base 12. Some of the pins 16 may be oriented 90 degrees from one another. For example, in the alternative embodiment shown in FIGS. 9–10, pin 19 may be oriented 90 degrees with respect to the other pins in order to account for variations in circuit board configurations. As shown in FIG. 7, each of the plurality of pins 16 may preferably include a rib portion 32 which extends along the pins 16 and which are retained between guides 34 which extend from an inner wall 36 of each of the plurality of cover openings 24 (see FIG. 15). When the cover 22 is attached to the base 12, the rib portion 32 compresses slightly to provide a secure fit and eliminate any rattling of the assembly. As shown in FIG. 7, a perimeter portion 13 of the cap portion 18 may preferably be chamfered to account for component tolerances and to facilitate the insertion of the pins 16 into the cover openings 24.

As shown in FIGS. 1–2, the plurality of pins 16 may preferably have a length which allows the pins 16 to pass through openings 38 formed in a planer substrate 40 and engage with the flange portion 26 of the cover 22. The planer substrate 40 may preferably include any flat substrate including, for example, a printed circuit board. It is contemplated that the base 12 and cover 22 may be used with various types of printed circuit boards including, for example, an Industry Standard Architecture (ISA) type circuit board or a Peripheral Component Interconnect (PCI) type circuit board. Each type of board may preferably allow for add-on expansion boards in a computer system such as a modem or video card. For a printed circuit board having a thickness of 0.062 inches, a pin 16 length of 0.27 inches (see dimension I of FIG. 7) has found to be acceptable. As shown in the embodiment of FIG. 7, the other dimensions of the pin 16 may be, for example: m=0.187 inches, n=0.064 inches, o=0.005 inches, p=0.035 inches, and q=0.015×0.015 chamfer. Other dimensions of the pin 16 may be utilized without departing from the spirit and scope of the invention.

The cover 22 may preferably be formed from a single piece of insulative material such as, for example, plastic. The plastic may preferably be flame retardant of to meet UL requirements and may consist of, for example, polycarbonate ABS plastic. The cover 22 may preferably be rectangular in shape, although other configurations are contemplated. As shown in FIG. 12, the cover 22 includes a plurality of recesses 31 formed in a perimeter portion 33 of the cover 22. This allows for the placement of small components under the perimeter portion 33 of the cover 22 which provides added flexibility to the placement of electronic components on the circuit board 40. The recesses 31 also provides a cooling function by allowing air to flow under the cover 22. As shown in FIGS. 1 and 13, the cover 22 may preferably include an opening 51 formed in an end wall 53 of the cover 22 to receive an electronic component such as, for example, a telephone jack 55.

Figure 4:
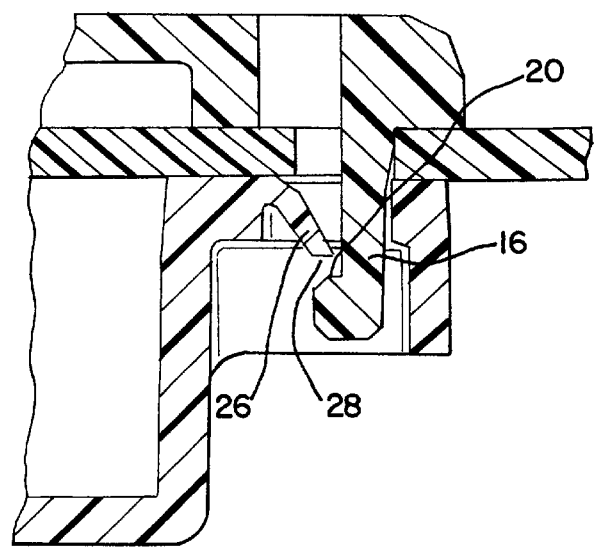
FIG. 4 is a cross-sectional view taken through line 4—4 of FIG. 3.

As shown in FIG. 14, the latch portion 26 of the cover 22 may preferably be angled at about 60 degrees from horizontal to allow the end portion 28 of the latch portion 26 to engage the contact surface 20 of the cap portion 18 of the pins 16 (see FIG. 4). The angle may vary depending upon dimensions of the cap portion 18 and the latch portion 26. In the embodiment shown, the cover 22 is adapted to fit over at least one electronic component 42 mounted on the circuit board 40 and allow the plurality of pins 16 to engage with the latch portion 26.

In the embodiment shown in FIGS. 11–15, the dimensions of the cover 22 may be, for example: a=3.195 inches, b=2.110 inches, c=3.09 inches, d=0.14 inches, e=1.56 inches, f=3.91 inches, g=0.587 inches, h=0.525 inches, i=2.38 inches, j=0.155 inches, k=0.080 inches, l=0.078 inches, m=0.040 inches, n=2X R 0.011 inches, o=R 0.064 inches, p=0.164 inches, q=0.092 inches, r=0.100 inches, s=0.032 inches, t=60 degrees, u=0.026 inches, v=0.012 inches, and w=0.080 inches. Other dimensions may be utilized without departing from the spirit and scope of the invention. For example, in the alternative embodiment shown in FIGS. 16–19, the dimensions of the cover 23 may be a=3.155 inches, b=1.777 inches, c=3.110 inches, d=0.50 inches, e=1.93 inches, f=2.093 inches, g=3.98 inches, h=0.587 inches, i=0.53 inches, j=2.38 inches, k=1.162 inches, l=0.154 inches, m=0.075 inches, n=0.077 inches, o=R 0.037 inches, p=0.099 inches, q=2X R 0.011 inches, r=R 0.064 inches, and s=2X 0.027 inches.

In operation, the cover 22 can be attached to the base 12 by inserting the plurality of pins 16 into the cover openings 24 formed in the cover 22. The latch portion 26 is deflected by the cap portion 18. The cap portion 18 is retained within the cover openings with the latch portion 26. Removal of the cover 22 from the base 12 is prevented by contacting an end portion 28 of the latch portion 26 against the contact surface 20 of the cap portion 18 and creating a moment to bias the latch portion toward the pins 16. The pin and latch configuration eliminates the need for separate fasteners such as rivets, screws or bolts thereby reducing manufacturing and labor costs, and overcomes the disadvantages associated with conventional welding techniques. Moreover, this particular configuration provides a low pin 16 insertion force and provides increased retention of the pin 16 due the fact that when force is applied to separate the cover 22 from the base 12, a moment acting on the flange portion 26 is created which biases the flange portion 26 toward the pin 16. The moment increases as the force increases. As a result, the greater the force applied to separate the cover 22 from the base 12, the greater the resultant moment biasing the flange portion 26 toward the pin 16.

The base 12 and cover 22 may be used to enclose an electronic component 42 mounted on a circuit board 40 to prevent a user from receiving an electric shock. The base 12 is positioned on a first side 44 of the circuit board 40. The plurality of pins 16 are inserted into the plurality of circuit board openings 38 so that the cap portion 18 extends past the second side 46 of the circuit board 46. The cover 22 is positioned on the second side 46 of the circuit board 40. The plurality of pins 16 are inserted into the cover openings 24.

The latch portion 26 is deflected with the cap portion 18. The cap portion 18 is retained within the openings 24 with the latch portion 26. Removal of the cover 22 from the base 12 is prevented by contacting an end portion 28 of the latch portion 26 against the contact surface 20 and creating a moment to bias the latch portion 26 toward the pins 16.

Figure 20:
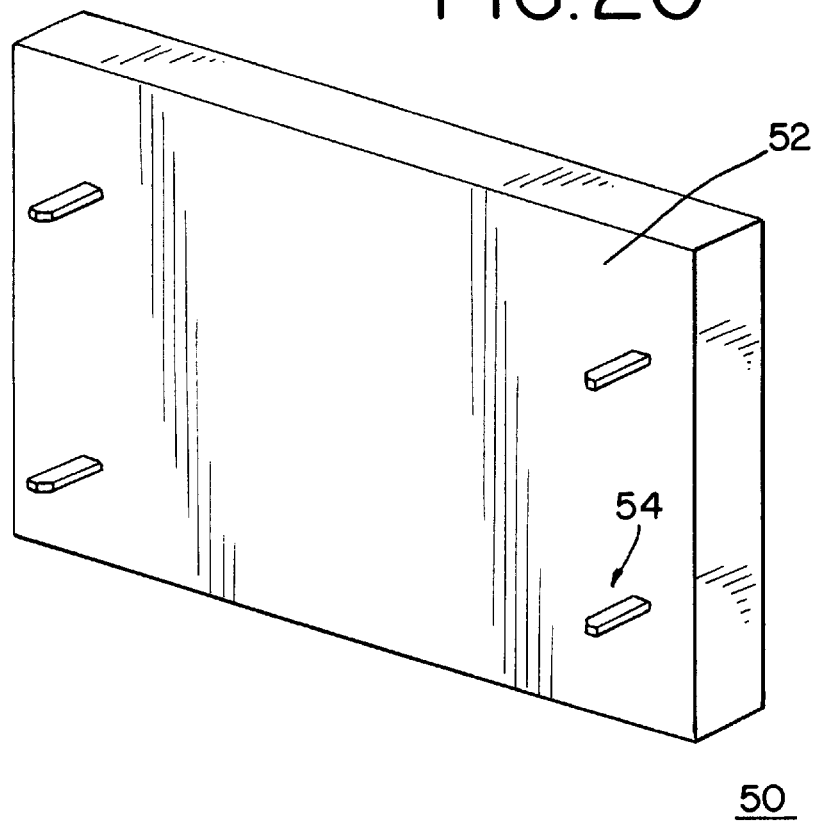
FIG. 20 is a perspective view of a disengagement apparatus which is made in accordance with the invention.
Figure 21:
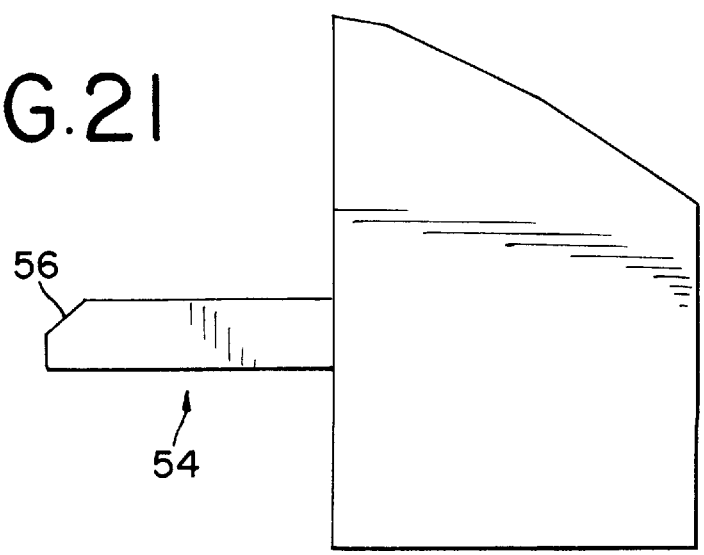
FIG. 21 is an enlarged view of a disengagement pin of FIG. 20.

The cover 22 may be removed from the base 12 with a disengagement apparatus 50 (see FIGS. 20–21) which includes a disengagement base 52 and a plurality of disengagement pins 54 which extend perpendicular from the disengagement base 52. In the embodiment shown, four disengagement pins 52 are provided. Each pin 52 includes a chamfered end portion 56. The disengagement pins 54 are inserted into a plurality of base openings 41 formed in the base adjacent the pins 16. The latch portion 26 is deflected away from the contact surface 20 of the cap portion 18 of the pins 16 to allow the cover 22 to be separated from the base 12. The advantage of this arrangement is that cover 22 can be easily and quickly separated from the base 12 without causing damage to the printed circuit board 40.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. A protective enclosure apparatus comprising:
 a base including a plurality of pins, the pins including cap portion, the cap portion including a contact surface, a cover including a plurality of cover openings formed therein for receiving the pins, and a latch portion communicating with each of the cover openings, the latch portion angled to allow an end portion of the latch portion to engage with the contact surface and to allow the latch portion to be biased toward the pins when the cover is pulled away from the base.

2. The apparatus of claim 1 wherein the latch portion is angled at about 30 degrees from an end wall of the cover.

3. The apparatus of claim 1 wherein the plurality of pins comprises four pins each of which are positioned adjacent a corner portion of the base.

4. The apparatus of claim 1 wherein the plurality of pins extend perpendicular from the base.

5. The apparatus of claim 1 wherein the plurality of pins include a rib portion which extends along the pins and which are retained between guides which extend from an inner wall of each of the plurality of cover openings.

6. The apparatus of claim 1 wherein the plurality of pins have a length which allows the pins to pass through substrate openings formed in a planer substrate and engage with the latch portion.

7. The apparatus of claim 6 wherein the planer substrate is a circuit board.

8. The apparatus of claim 1 wherein the base is a substantially planar member.

9. The apparatus of claim 1 wherein the base is formed from a single piece of insulative material.

10. The apparatus of claim 9 wherein the insulative material is plastic.

11. The apparatus of claim 1 wherein the cover is formed from a single piece of insulative material.

12. The apparatus of claim 11 wherein the insulative material is plastic.

13. The apparatus of claim 1 wherein the cover is adapted to fit over at least one electronic component mounted on a circuit board and allow the plurality of pins to engage with the latch portion.

14. A method of operating a protective enclosure apparatus comprising:

providing a base including a plurality of pins, the pins including cap portion, the cap portion including a contact surface, a cover including a plurality of cover openings formed therein for receiving the pins, and an angled latch portion communicating with each of the cover openings;

inserting the plurality of pins into the cover openings;

deflecting the latch portion with the cap portion; and retaining the cap portion within the cover openings with the latch portion.

15. The method of claim 14 further comprising:

preventing disengagement of the cover from the base by contacting an end portion of the latch against the contact surface and creating a moment to bias the latch portion toward the pin.

16. A method of enclosing an electronic component mounted on a circuit board to prevent electric shock comprising:

providing circuit board having a first side and a second side, at least one electronic component mounted onto the first side of a circuit board, the circuit board having a plurality of circuit board openings, a base including a plurality of pins, the pins including cap portion, the cap portion including a contact surface, a cover including a plurality of cover openings formed therein for receiving the pins, and an angled latch portion communicating with each of the cover openings;

positioning the base on the second side of the circuit board;

inserting the plurality of pins into the plurality of circuit board openings so that the cap portion extends past the first side of the circuit board;

positioning the cover portion on the first side of the circuit board;

inserting the plurality of pins into the cover openings;

deflecting the latch portion with the cap portion;

retaining the cap portion within the cover openings with the latch portion; and preventing removal of the cover from the base by contacting an end portion of the latch portion against the contact surface and creating a moment to bias the latch portion toward the pins.

17. The method of claim 16 further comprising:

providing a plurality of base openings formed in the base adjacent the plurality of pins, a disengagement apparatus including a disengagement base and a plurality of disengagement pins which extend from the disengagement base;

inserting the disengagement pins into the base openings; and deflecting the latch portion away from the contact surface to allow the cover to be separated from the base.

* * * * *